United States Patent [19]
Yoneda et al.

[11] Patent Number: 5,774,034
[45] Date of Patent: Jun. 30, 1998

[54] MAGNET ASSEMBLY IN MRI INSTRUMENT

[75] Inventors: Yuhito Yoneda; Koji Miyata; Ken Ohashi; Dai Higuchi, all of Fukui-ken, Japan

[73] Assignee: Shin-Etsu Chemical Co., Ltd., Tokyo, Japan

[21] Appl. No.: 706,349

[22] Filed: Aug. 30, 1996

[30]     Foreign Application Priority Data

Sep. 19, 1995   [JP]   Japan .................................... 7-239530

[51] Int. Cl.⁶ .................................................. G01V 3/00
[52] U.S. Cl. .......................................... 335/301; 324/320
[58] Field of Search .................................... 335/296–306; 324/318, 319, 320

[56]              References Cited

U.S. PATENT DOCUMENTS

| | | | |
|---|---|---|---|
| 4,631,481 | 12/1986 | Young et al. | 324/320 |
| 4,943,774 | 7/1990 | Breneman | 324/318 |
| 5,061,897 | 10/1991 | Danby et al. | 324/318 |
| 5,363,078 | 11/1994 | Ries et al. | 335/297 |
| 5,495,171 | 2/1996 | Danby et al. | 324/318 |
| 5,555,251 | 9/1996 | Kinanen | 324/319 |

FOREIGN PATENT DOCUMENTS 2080033   3/1990   Japan .

*Primary Examiner*—Renee S. Luebke
*Assistant Examiner*—Raymond Barrera
*Attorney, Agent, or Firm*—Wenderoth, Lind & Ponack, L.L.P.

[57]              ABSTRACT

Proposed is an improvement in a magnet assembly of an MRI instrument of the permanent magnet type comprising a pair of permanent magnets facing each other and forming a magnet gap therebetween. A pair of pole pieces each of which are mounted on one of the permanent magnets and a pair of gradient-field coils each of which are mounted on one of the pole pieces where both the pole pieces and coils face the gap. With an object of the invention to cancel the adverse influences caused by the residual magnetization of the pole pieces by the gradient magnetic field generated in the gradient-field coils. The invention proposes providing a pair of magnetic-field compensation members each on one of the gradient-field coils so that the residual magnetization in the compensation members generates a magnetic field which is compensatory for the magnetic field due to the residual magnetization in the pole pieces.

3 Claims, 2 Drawing Sheets

MAGNET ASSEMBLY IN MRI INSTRUMENT

BACKGROUND OF THE INVENTION

The resent invention relates to an improvement in a novel magnet assembly in magnetic resonance, imaging instruments such as medical MRI instruments having permanent magnets capable of generating a highly uniform magnetic field in the space between oppositely facing permanent magnets.

The magnet assembly in a magnetic resonance imaging instrument with permanent magnets used for the purpose of medical diagnosis is referred to as an MRI instrument and have become a major trend in recent years. The MRI instrument has a pair of strong permanent magnets, such as rare earth-based permanent magnets, disposed in such a manner as to face oppositely and symmetrically from each other, forming a gap space for magnetic field generation herebetween. This gap space allows for the medical inspection of a patient through MRI. It is very important to note that in order to ensure reliableness of the diagnosis, the magnetic field genrated in the gap space between the opposed permanent magnets, referred to as the magnet gap space hereinafter, is as highly uniform as possible so as to ensure the sharpness of the images. In this regard, it is a common practice that a pole piece made from a magnetically soft material, such as soft iron and the like, be mounted onto the surface of each of the opposed permanent magnets so as to face the magnet gap space. It is necessary to generate a gradient magnetic field in the magnet gap space to provide magnetic resonance imaging. This is accomplished by a magnetic modulating means such as a gradient-field coil mounted on the pole piece. However, a problem is presented in that the uniformity of the magnetic field is disturbed by the residual magnetization in the pole pieces resulting in a decrease in the sharpness of the images or distortion thereof.

Occurrence of the above mentioned residual magnetization in the pole pieces is a phenomenon more or less unavoidable in any magnetic material. It is a consequence of the magnetic hysteresis regardless of how magnetically soft the magnetic material of the pole pieces may be. It is conventional in the manufacturing of MRI instruments to use pole pieces made from or in a combination with soft iron and other magnetically soft materials such as silicon steels, soft ferrites, Permalloys and the like. These materials are magnetically softer than soft irons and provide a decrease in the residual magnetization of the pole pieces. Although the residual magnetization of the pole pieces can of course be decreased by increasing the amount of these highly soft magnetic materials; these magnetic materials cannot practically be used in large amounts because of their cost as compared with conventional soft irons. Therefore, improvements in the imaging quality by decreasing the residual magnetization of the pole pieces can only be accomplished with an increase in the manufacturing costs of the MRI instrument.

SUMMARY OF THE INVENTION

In view of the above described problems and disadvantages of magnet assemblies in the prior art, the present invention accordingly has an object to provide a novel and improved magnet assembly in an MRI instrument. The improvement would greatly reduce the adverse influences on the quality of the magnetic resonance images due to the residual magnetization in the pole pieces without substantially increasing the manufacturing costs of the MRI instrument.

Thus, the present invention provides a magnet assembly in an MRI instrument which comprises:
(a) a pair of permanent magnets oppositely disposed to face each other with a magnet gap space therebetween; a static magnetic field being generated thereby in the magnet gap space;
(b) a pair of pole pieces each mounted on one of the permanent magnets facing the magnet gap space;
(c) a pair of magnetic modulating coils to generate a gradient magnetic field relative to the static magnetic field generated by the permanent magnets, each being mounted on one of the pole pieces facing the magnet gap space; and
(d) a pair of magnetic-field compensation members made from a ferromagnetic material having a coercive force not exceeding 100 Oe, each member being mounted on one of the magnetic modulating coils facing the magnetic gap space.

The above mentioned magnetic field compensation member is a disc or circular sheet made from a magnetically soft ferromagnetic material such as soft iron and has a thickness in the range from 0.005 mm to 0.5 mm.

BRIEF DESCRIPTION OF THE DRAWING

FIGS. 2 and 3 show the residual magnetization of the pole piece when a gradient magnetic field is applied in the X-direction and Z-direction, respectively.

DETAILED DESCRIPTION OF THE PREFERRED EMBODIMENTS

As is mentioned above, occurrence of residual magnetization in the pole pieces is a more or less unavoidable phenomenon as a consequence of the magnetic hysteresis possessed by any magnetic material including the magnetically soft magnetic material from which the pole pieces are made. The primary idea of the inventors leading to the present invention is that the adverse influences, due to the residual magnetization in the pole pieces, could be compensated for by providing a magnetic compensation means in which residual magnetization can be induced to give a compensating magnetic field to the magnetic field in the magnet gap space. This compensating magnetic field is in an inverse direction to that of the magnetic field due to the residual magnetization in the pole pieces where the absolute values of the two magnetic fields is substantially identical.

Figure 1:
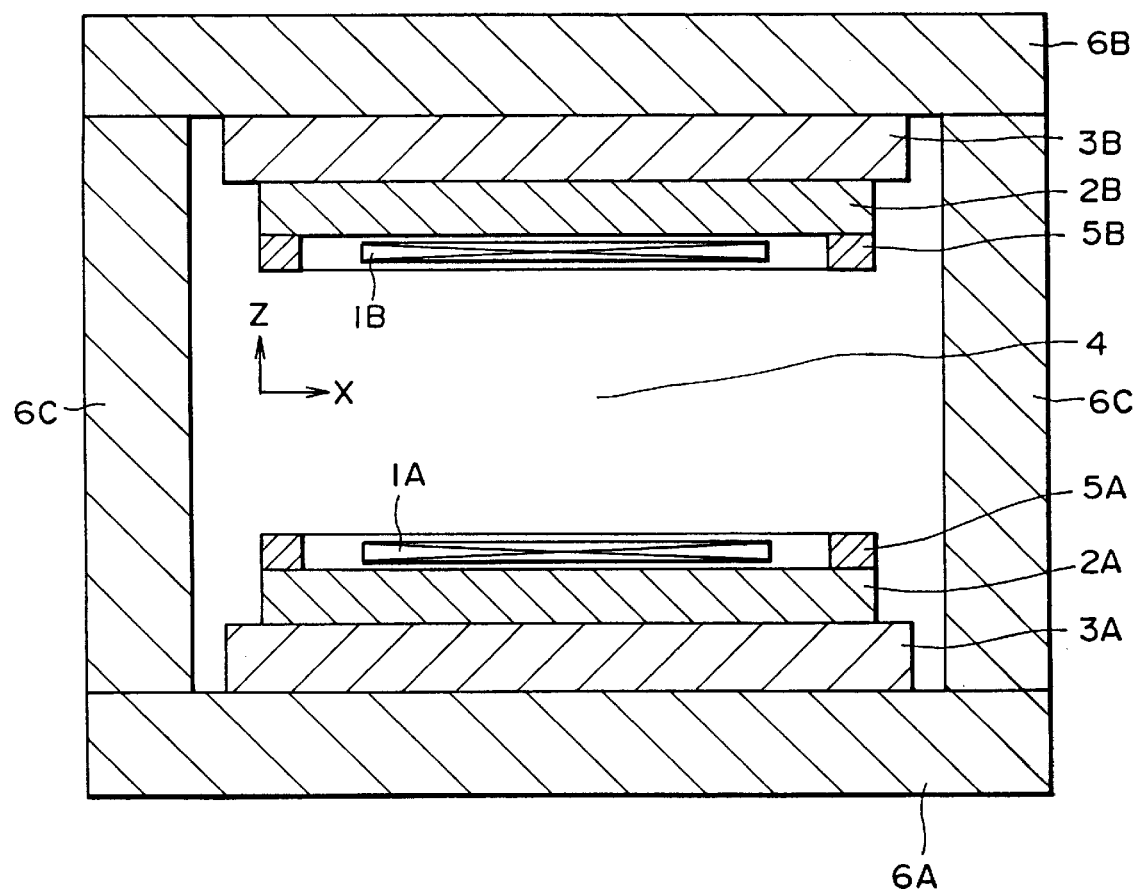
FIG. 1 is a schematic transverse cross sectional view of a conventional magnet assembly in an MRI instrument.

FIG. 1 of the accompanying drawing is a schematic transverse cross sectional view of a conventional magnet assembly of an opposed-magnet type MRI instrument. A pair of permanent magnets 3A and 3B are disposed symmetrically on respective base yokes 6A and 6B to face each other and form a magnet gap space 4 therebetween. Magnet gap space 4 is formed by connecting the base yokes 6A, 6B with connecting yokes 6C. A pair of pole pieces 2A and 2B made from a soft magnetic material are mounted on respective permanent magnets 3A, 3B facing the magnet gap space 4. Each of the pole pieces 2A, 2B has a circular rib 5A and 5B along the periphery of the circular pole piece 2A, 2B which improves the uniformity of the magnetic field in the magnet gap space 4. As a means to generate a gradient magnetic field in the magnet gap space 4, the gradient-field coils 1A and 1B are each surrounded by the circular rib 5A, 5B. The height of the gradient field coil 1A, 1B is usually shorter than that of the circular rib 5A, 5B making the effective height of the magnet gap space 4 decreased by the gradient-field coils 1A, 1B.

Figure 2:
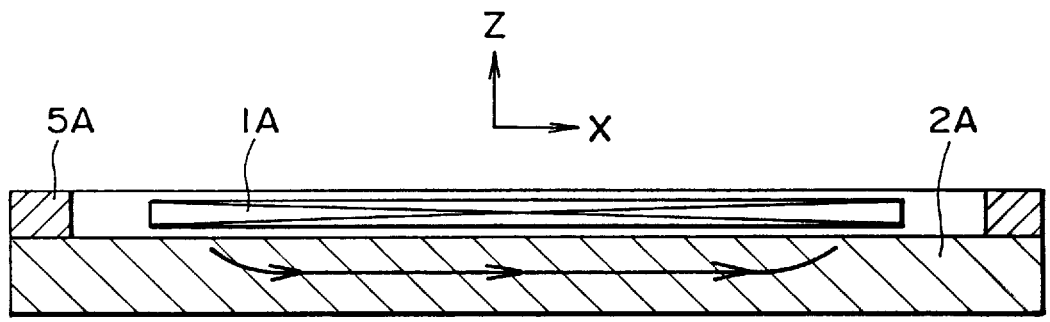
FIGS. 2 and 3 are schematic transverse cross-sectional views of the pole piece and gradient-field coil in the lower half of the magnet assembly of FIG. 1.
Figure 3:
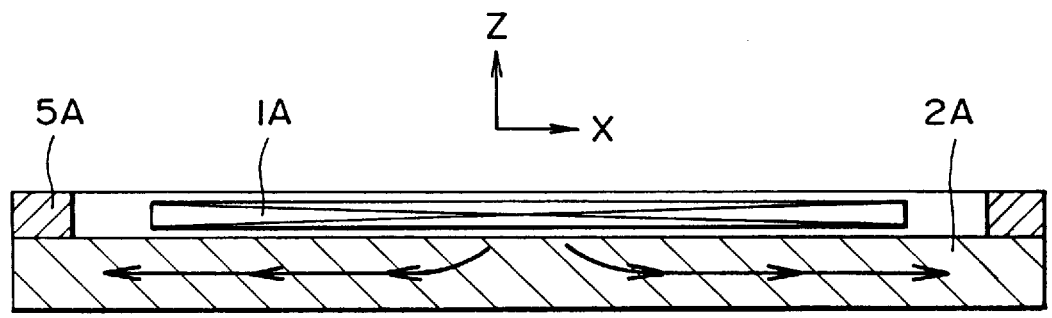
Figure 4:
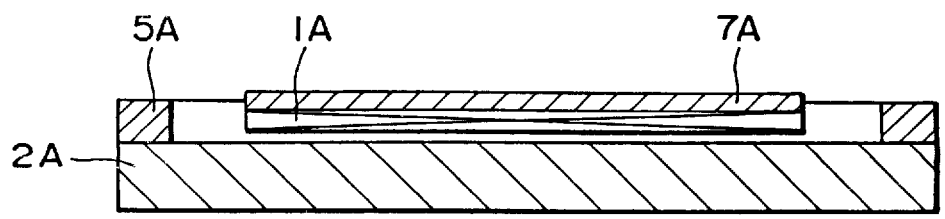
FIG. 4 is a schematic transverse cross sectional view of the main part of the lower half of the inventive magnet assembly having a magnetic-field compensation member.

When a gradient magnetic field is generated by energizing the gradient-field coils 1A, 1B, the pole pieces 2A, 2B are magnetized in the direction indicated by the arrows in FIGS. 2 and 3. This is the phenomenon of residual magnetization which influences the uniformity of the magnetic field. The idea leading to the invention is accordingly that the adverse influences due to the residual magnetization of the pole pieces 2A, 2B could be compensated by a magnetic compensating means provided in each of the pole pieces 2A, 2B, where the direction of the residual magnetization is opposite to that of the pole piece 2A or 2B. The result is that the contribution to the magnetic field in the magnet gap space 4 is approximately equal to the absolute value of the residual magnetization in the pole piece 2A, 2B.

Namely, the present invention proposes that the magnetic compensating means mentioned above provides a magnetic-field compensation member 7A and 7B being made from a ferromagnetic material and located on each of the gradient-field coils 1A, 1B and facing the magnet gap space 4. Since the magnetic-field compensation member 7A, 7B is located on the opposite side of the gradient-field coil 1A, 1B, relative to the pole piece 2A, 2B, the direction of the residual magnetization therein is reversed to that of the pole piece 2A, 2B. Accordingly, the magnetic field due to the residual magnetization in the magnetic-field compensation member 7A, 7B compensates for the magnetic field due to the residual magnetization in the pole piece 2A, 2B.

When the magnetic field due to the pole pieces 2A, 2B and the ferromagnetic compensation members 7A, 7B are identical in the absolute values; it can be expected that the adverse influences due to the residual magnetization in the pole pieces 2A, 2B can be completely canceled. Since the magnetic-field compensation member 7A, 7B faces and is located at a position closer to the magnet gap space 4 than the pole piece 2A, 2B, the strength of the magnetic field at a point due to a magnetic pole is inversely proportional to the distance between the point and the magnetic pole. Therefore, it is readily understood that the residual magnetization in the magnetic-field compensation member 7A, 7B can be smaller than the residual magnetization in the pole piece 2A, 2B.

A problem has to be taken into consideration in connection with the magnetic-field compensation member 7A, 7B installed on the gradient-field coil 1A, 1B and facing magnet gap space 4. Namely, the magnetic field compensation member 7A, 7B serves as a magnetic path for the magnetic flux generated by the gradient-field coil 1A, 1B. The effective magnetic field in the magnet gap space 4 due to the gradient-field coil 1A, 1B is necessarily decreased by the absorption of the magnetic flux in the magnetic-field compensation 7A, 7B resulting in a decrease in the efficiency of gradient-field generation by the coils 1A, 1B. This problem can most nearly be solved by magnetizing the magnetic-field compensation member 7A, 7B to a point nearly equal to the magnetic saturation experienced when the member 7A, 7B is in the magnetic field generated by the gradient-field coil 1A, 1B. This is so because a magnetically saturated body exhibits an effect of magnetic flux absorption no more than that of air. The result being that the efficiency of the gradient-field coil 1A, 1B in the generation of the gradient magnetic field in the magnet gap space 4 is decreased only slightly.

The magnetic-field compensation member 7A, 7B mounted on the gradient-field coil 1A, 1B is made desirably from a magnetic material having a low coercive force, for example: 100 Oe or lower, in order to readily reach magnetic saturation by the magnetic field generated by the gradient-field coil 1A, 1B. Suitable ferromagnetic materials in this regard include soft irons, silicon steels, soft ferrites, Permalloys and the like. Since the gradient magnetic field produced by gradient-field coil 1A, 1B is not generated continuously but pulse-wise, it is important for the magnetic-field compensation members 7A, 7B, as also pole pieces 2A, 2B, to be designed and constructed in such a fashion that the eddy current due to the application of the pulse magnetic field be minimized. This is designed in order to avoid degradation of the quality of the magnetic resonance images along with the means to decrease the residual magnetization. The magnetic-field compensation member 7A, 7B is laminated with thin sheets of a metallic material such as a soft iron, silicon steel, Permalloy and the like which have low electric resistances. The eddy current can be reduced by dividing the member into small electrically insulated portions each distanced from the other or by providing interlayer insulation between the sheets. It is advantageous in this regard that the magnetic-field compensation member 7A, 7B of such a composite structure be designed with a ferromagnetic material having high electric resistance such as soft ferrites in combination with a metallic ferromagnetic material.

The magnetic-field compensation members 7A, 7B each have a disc like configuration, like the pole pieces 2A, 2B, in order that the residual magnetization therein be symmetrical to that in the pole pieces 2A, 2B. The configurations being not particularly limitative thereto with optional modifications in compliance with the configuration of the gradient-field coils 1A, 1B and other parts. When the magnetic-field compensation member 7A, 7B is in the form of a disc, the thickness of the disc is preferably in the range from 0.005 mm to 0.5 mm depending on the material's saturation magnetization. When the thickness is too small, no substantial compensating effect can be obtained on the magnetic field due to the residual magnetization in the pole pieces 2A, 2B. When the thickness is too large, the magnetization of the magnetic-field compensation member 7A, 7B as a whole can hardly reach saturation by the application of the gradient magnetic field resulting in a decrease in the efficiency of generation of the gradient magnetic field. In short, the magnetic-field compensation member 7A, 7B is designed to have such a thickness and surface area that the volume thereof is sufficiently large in order that the residual magnetization therein can fully compensate for the residual magnetization in the pole piece 2A, 2B within the above mentioned limits of the thickness.

When the magnetic-field compensation members 7A, 7B satisfy the above mentioned requirements and are mounted on gradient-field coils 1A, 1B, respectively (facing the magnet gap space 4), the magnetic field due to the residual magnetization in the pole pieces 2A, 2B can be fully compensated to exhibit an effect apparently equivalent to the reduction or disappearance of the residual magnetization. This is done without undertaking any means to have the pole pieces 2A, 2B combined with an expensive material. The principle of the present invention is applicable to a magnet assembly in which the residual magnetization of the pole pieces is small and by undertaking the herein described invention further decreases the adverse influences of the residual magnetization in the pole pieces and improves the quality of the magnetic resonance images.

In the following, an embodiment of the present invention is described by way of an Example.

EXAMPLE

A magnet assembly for an MRI instrument was constructed to have a structure generally in accordance with FIG. 1, in which the pole pieces had a diameter of 1100 mm and the height of the magnet gap space 4 was 400 mm and the strength of the magnetic field at the center point of the magnet gap space 4 was 0.2 T. The gradient-field coils 1A, 1B were energized by passing such an electric current that the effective gradient magnetic field in the vertical direction was just ±0.0001 T/cm and the non-uniformity in the magnetic field within the magnet gap space 4 was determined. The non-uniformity of the magnetic field implied here was a ratio obtained by dividing the difference in the magnetic field between two points, one, 10 cm above and, the other, 10 cm below the center point of the magnet gap space 4 by the magnetic field at the center point, i.e., 0.2 T. The non-uniformity was found to be +14 ppm. The sign of + means that the magnetic field at the upper point was larger than the magnetic field at the lower point.

As an embodiment of the present invention, a magnetic-field compensation member 7A, 7B made from a 0.05 mm thick soft iron sheet having a diameter of 800 mm was mounted on each of the gradient-field coils 1A, 1B to face the magnet gap space 4 in the above described conventional magnetic assembly. The magnetic-field compensation member 7A, 7B as in the form of a disc which was divided into small pieces electrically insulated from each other in order to decrease the eddy currents and to prevent a decrease in the efficiency of generation of the gradient magnetic field. The results of measurements undertaken under the same conditions as above adjusting for the magnetic-field compensation members 7A, 7B were that the effective gradient magnetic field in the vertical direction was 0.000098 T/cm and the non-uniformity of the magnetic field was +3 ppm indicating a remarkable improvement in the uniformity of the magnetic field without substantially decreasing the effective gradient magnetic field.

To test the effect of the thickness of the magnetic-field compensation members 7A, 7B, the same experiment as above was repeated except that each of the 0.05 mm thick magnetic-field compensation members were replaced with another magnetic-field compensation member which was 1 mm thick, made from the same soft iron sheets and each sheet being electrically insulated from the adjacent sheet. The results of measurements undertaken under the same conditions as above adjusting for the increase in the thickness of the magnetic-field compensation members were that the effective gradient magnetic field in the vertical direction was 0.000032 T/cm and the non-uniformity of the magnetic field was −44 ppm. The negative value of the non-uniformity indicated overcompensation of the residual magnetization in the pole pieces by the magnetic-field compensation members as a consequence of the excessively large thickness thereof. The great decrease in the effective gradient magnetic field was presumably due to absorption of a part of the magnetic flux from the gradient-field coils 1A, 1B by the magnetic-field compensation members 7A, 7B having a larger thickness.

What is claimed is:

1. A magnet field control assembly for use in a magnetic resonance imaging instrument, comprising:

first and second permanent magnets disposed opposite one another to form therebetween a magnetic gap space;

a first pole piece mounted on said first permanent magnet;

a first magnetic modulating coil mounted on said first pole piece;

a first magnetic field compensation member mounted on said first magnetic modulating coil, having a thickness in a range from 0.005 mm to 0.5 mm and formed of a magnetically soft ferromagnetic material;

a second pole piece mounted on said second permanent magnet;

a second magnetic modulating coil mounted on said second pole piece;

a second magnetic field compensation member mounted on said second magnetic modulating coil, having a thickness in a range from 0.005 mm to 0.5 mm and formed of a magnetically soft ferromagnetic material;

said first magnetic modulating coil being located between said first magnetic field compensation member and said first pole piece;

said second magnetic modulating coil being located between said second magnetic field compensation member and said second pole piece;

wherein said first and second permanent magnets are operative to generate a static magnetic field in said magnetic gap space;

wherein said magnetic modulating coils are operative to generate a gradient magnetic field relative to the static magnetic field; and wherein said magnetic field compensation members are operative to counteract a residual magnetization of said pole pieces.

2. A magnet field control assembly, as claimed in claim 1, wherein said magnetically soft ferromagnetic material has a coercive force not exceeding 100 Oe.

3. A magnet field control assembly, as claimed in claim 1, wherein said magnetic field compensation members, said magnetic modulating coils and said pole pieces are all mounted so as to have a surface thereof facing said magnetic gap space.

* * * * *